United States Patent [19]

Shiraishi et al.

[11] Patent Number: 5,450,814
[45] Date of Patent: Sep. 19, 1995

[54] SINGLE CRYSTAL PULLING APPARATUS HAVING SLIDABLE SHIELD PLATE TO CONTROL AREA OF OPENING AROUND SINGLE CRYSTAL

[75] Inventors: Yutaka Shiraishi; Kazutaka Terashima, both of Kanagawa, Japan

[73] Assignees: Research Development Corporation of Japan, Tokyo; Yutaka Shiraishi, Hiratuka; Kazutaka Terashima, Ebina, all of Japan

[21] Appl. No.: 135,563

[22] Filed: Oct. 14, 1993

[30] Foreign Application Priority Data

Oct. 26, 1992 [JP] Japan .................. 4-310966

[51] Int. Cl.⁶ .................................. C30B 15/14
[52] U.S. Cl. .................. 117/217; 117/213; 117/218; 117/202; 117/30; 117/35
[58] Field of Search .............. 117/15, 213, 217, 218, 117/202, 30, 35

[56] References Cited

U.S. PATENT DOCUMENTS

| | | | |
|---|---|---|---|
| 2,979,386 | 4/1961 | Shockley et al. | 117/217 |
| 4,330,361 | 5/1982 | Kuhn-Kuhnenfeld et al. | 117/217 |
| 4,390,505 | 8/1983 | Taylor et al. | 117/217 |
| 4,402,786 | 9/1983 | Little | 117/217 |
| 4,956,153 | 9/1990 | Yamagishi et al. | 117/217 |
| 5,316,742 | 5/1994 | Tomioka et al. | 117/217 |

FOREIGN PATENT DOCUMENTS 5-294784  11/1993  Japan .................. 117/217

*Primary Examiner*—Robert Kunemund
*Attorney, Agent, or Firm*—Nikaido, Marmelstein, Murray & Oram

[57] ABSTRACT

A plurality of shield blades 31 for defining an opening 25 surrounding a single crystal 15 are provided between a melt 14 received in a crucible 10 and a screen 30. The shield blades 21 are carried by operation rods 23 so as to make the gap between the inner edges of the shield blades 23 and the surface of the single crystal 15 constant. Since crystal growth continues under the same condition from the beginning to the end, an obtained single crystal 15 is free from defects such as dislocations and excellent in homogenieity.

4 Claims, 3 Drawing Sheets

SINGLE CRYSTAL PULLING APPARATUS HAVING SLIDABLE SHIELD PLATE TO CONTROL AREA OF OPENING AROUND SINGLE CRYSTAL

BACKGROUND OF THE INVENTION

The present invention relates to a single crystal pulling apparatus having a plurality of shield blades capable of sliding motion for properly controlling the area of opening around a single crystal being pulled from a melt in the progress of crystal growth.

Czochralski method is one of the representative methods for the growth of single crystal from a melt. In Czochralski method, a melt is prepared in a crucible by melting a starting material for a single crystal. A seed crystal is brought into contact with the melt, so that a single crystal is grown on the seed crystal and pulled up from the melt.

During pulling the single crystal, components evaporated from the melt are likely to be condensed. The condensed components adhere onto various devices or parts incorporated in the apparatus, or drop in the melt. The dropping causes the inducement of various defects, e.g. dislocation and heterogeneity, in the growing single crystal.

For instance, volatile SiO is formed by the reaction of Si melt with a quartz crucible during pulling a Si single crystal. The formed SiO is condensed and deposited on the surface of internal devices at a relatively low temperature or on the surface of a growing Si single crystal. SiO deposited at the low-temperature part of the internal device would be dropped in the Si melt due to certain physical or thermal impacts. The dropping causes the fluctuation of the Si melt in the distribution of concentration or temperature, so that defects are induced into the growing Si single crystal. On the other hand, SiO deposited on the surface of the growing Si single crystal causes the inducement of defects, e.g. dislocations and strains, originated in the mismatching of crystal orientation.

The formation of defects derived from the condensation of evaporated components such as SiO is inhibited by providing a cover above the melt.

However, the formation of defects is caused by CO evaporated from carbonaceous internal devices and gaseous compoents residing in the atmosphere above the melt, too. These harmful components are removed from the crystal growth zone by the flow of inert gas. SiO, CO and other components which would have harmful influences on the growth of a single crystal are accompanied with the flow of the inert gas and discharged to the outside.

For instance, Japanese Patent Publication 57-40119 discloses the method wherein a cover is located above the surface of a melt and inert gas is let flow through a space between the cover and the surface of the melt. According to this method, a crucible 2 is rotatably supported with the rotary shaft 1 capable of vertical motion, and a screen 3 is located above the crucible 2, as shown in FIG. 1.

The screen 3 has an annular projection $3c$ extending through a connector part $3b$ from an annular rim $3a$. The annular projection $3c$ is faced to the surface of a single crystal 4 being pulled up from a melt $4a$. In response to the growth of the single crystal 4, a material $4b$ is supplementally fed to the crucible 2 through a heated quartz tube $5a$ passing through a side wall 5, to compensate for the melt $4a$ consumed in the growth of the single crystal 4. The melt $4a$ in the crucible 2 is held at a proper temperature by a heater 6 provided around the crucible 2.

A seed crystal $4c$ is attached to the lower end of a pulling shaft 7. The pulling shaft 7 is carried upwards in response to the growing speed of the single crystal 4. Hereon, inert gas such as Ar or He is introduced into a space above the screen 3. The inert gas flows through a gap $g_1$ between the single crystal 4 and the annular projection $3c$ into a space above the crucible 2 covered with the screen 3. The inative gas successively flows through a gap $g_2$ formed at the edge of tile crucible 2, a gap $g_3$ between a heat insulator 8 and the rotary shaft 1 and a gap $g_4$ between the heat insulator 8 and the heater 6 and then to the outside. This inert gas flow accompanies SiO evaporated from the melt $4a$, CO evaporated from carbonaceous internal devices and other harmful ingredients to the outside.

The inducement of defects in an obtained sigle is inhibited to some extent by the flow of the inert gas to remove harmful ingredients from the crystal growth zone. However, the inner edge of the annular projection $3c$ for defining the gap $g_1$ is located at a constant position, since the screen 3 is a unitary body made of SiC, carbon or the like. On the other hand, the single crystal 4 being pulled from the melt $4a$ changes its diameter in the course of crystal growth, so that the gap $g_1$ is changed during the crystal growth. Concretely, the gap $g_1$ from the inner edge of the annular projection $3c$ to the surface of the single crystal 4 is large at the initial stage of the crystal growth, while the gap $g_1$ is held at a constant value when the crystal growth continues in a stationary state.

Since the gap $g_1$ is usually determined on the assumption that the single crystal grows in the stationary state, the gap $g_1$ is too large at the initial stage of crystal growth. The large gap causes the unexpected flow of inert gas at the initial stage, and SiO, carbon or the like adherently condensed on the internal devices is not effectively prevented from dropping onto the surface of the melt $4a$. As a result, defects such as dislocations are likely to be induced into the single crystal 4 at the initial stage.

The unitary screen 3 is effective for manufacturing a single crystal 4 having a constant diameter. However, when a single crystal 4 different in diameter is to be manufactured, the gap $g_1$ is changed in response to the diameter. The changed gap $g_1$ is not suitable for the formation of a predetermined gas flow. In this sense, it is necessary to prepare a plurality of screens 3 each different from the other in diameter corresponding to the diameter of each single crystal to be manufactured.

Besides, the amount of the melt $4a$ in the crucible 2 is reduced as the growth of the single crystal 4. The consumption of the melt $4a$ causes the reduction of the contact surface between the melt $4a$ and the quartz crucible 2, so that the concentration of oxygen in the single crystal 4 becomes less from the intilal stage to the final stage of the crystal growth.

In order to keep the concentration of oxygen in the growing single crystal 4 at a predetermined value, the crucible 2 is rotated at a higher speed in the progress of the crystal growth to increase the amount of oxygen dissolved from the quartz crucible 2 into the melt $4a$. However, the increase of the rotation speed changes the convection flow of the melt $4a$ in the crucible 2. Consequently, the gradient of a temperature and the concentration of oxygen in the melt 4a at the final stage differs from those at the initial stage, causing the inducement of defects into the single crystal.

SUMMARY OF THE INVENTION

An object of the present invention is to manufacture a high-quality single crystal free from defects while holding a gap around a growing single crystal at a proper value in response to the progresss of crystal growth.

Another object of the present invention is to control the gap around the growing single crystal at the proper value determined on the basis of gaseous components in the atmosphere above a crucible.

According to the present invention, there is provided a new single crystal pullling apparatus having a shield member capable of sliding motion. The shield member comprises a plurality of shield blades for defining an opening at the position to pull up a single crystal from a melt received in a crucible. The shield member is located between the surface of the melt and a screen provided above the crucible. The shield blades can be carried in response to the diameter of the single crystal being pulled, in the manner such that the area of a space from the inner edge of each shield blade to the surface of the single crystal is held at a value suitable for crystal growth under the same condition.

An amount of SiO evaporated from the melt is detected by measuring CO and $CO_2$ formed by the reaction of $SiO + C \rightarrow CO$, $CO_2$ between SiO and a high-temperature carbon heater. A proper gap between the shield blades and the surface of the single crystal necessary for the appropriate amount of evaporated SiO at each stage of the crystal growth is calculated on the basis of the detected SiO value. The shield blades are carried to a position corresponding to the calculation result. Thereby, the flow speed of inert gas is controlled to hold the concentration of oxygen in the melt at a proper level. The single crystal obtained in this way has the most appropriate concentration of oxygen.

The present invention will be apparent from the following description with reference to the drawings attached, although the following description does not have any restriction on the scope of the present invention.

DETAILED DESCRIPTION OF THE PREFERRED EMBODIMENTS

Figure 2:
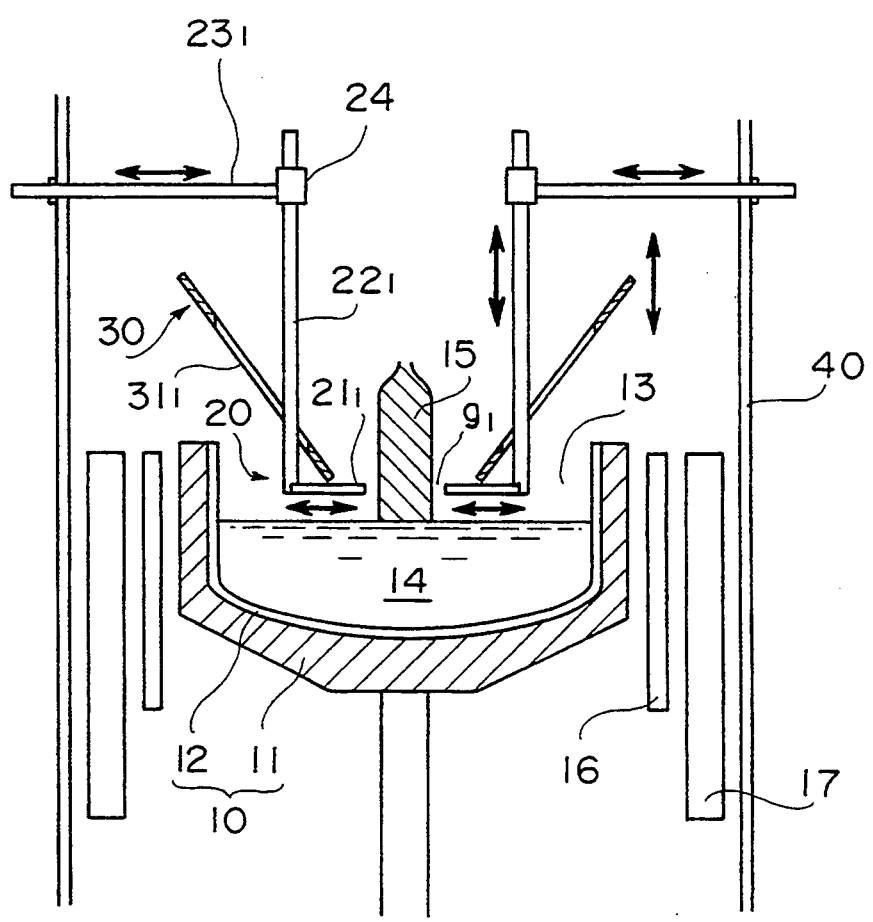
FIG. 2 is a schematic view illustrating a single crystal pulling apparatus according to the present invention.
Figure 3:
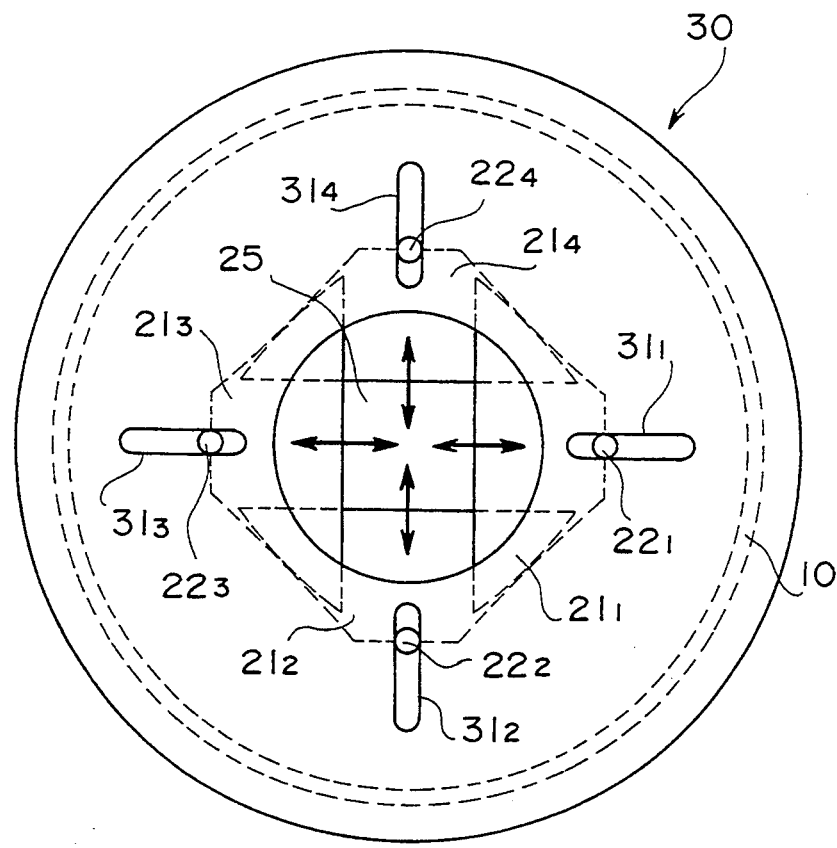
FIG. 3 is a view illustrating a mechanism for the movement of shield blades.

The single crystal pulling apparatus according to the present invention has a shield member 20 provided above a crucible 10, as shown in FIG. 2. The shield member 20, being made of a heat resistant material such as SiC or carbon, comprises four shield blades $21_1$–$21_4$. Each shield blade $21_1$–$21_4$ is arranged in a state overlapping the adjacent blade $21_1$–$21_4$, as shown in FIG. 3. The shield blades $21_1$–$21_4$ are fixed to the lower ends of support rods $22_1$–$22_4$, respectively, inserted into slots $31_1$–$31_4$ extending along the slope of an inversed conical cover 30. The support rods $22_1$–$22_4$ are inserted into operation rods $23_1$–$23_4$, respectively. The operation rods $23_1$–$23_4$ extend horizontally and pass through a side wall 40.

The operation rods $23_1$–$23_4$ are movable along the horizontal direction. The support rods $22_1$–$22_4$ capable of vartical motion are connected through joints 24 to the operation rods $23_1$–$23_4$, respectively. The support rods $22_1$–$22_4$ may be carried along the vertical direction by therotation of the operation rods $23_1$–$23_4$, by providing a drive gearat the inner top end of each operation rod $23_1$–$23_4$ and a drivengear, to be engaged with said drive gear, at the upper part of each support rod $22_1$–$22_4$.

The crucible 10 has a double structure comprising a graphite crucible 11 and a quartz crucible 12 inserted in the graphite crucible 11. The quartz crucible 12 has an inner diameter predetermined at a value larger than the diamter defined by the outer edges of the shield blades $21_1$–$21_4$ which have been carried to the outermost positions. Hereby, a gap 13 is defined between the quartz crucible 12 and the shield blades $21_1$–$21_4$.

The crucible 10 is surrounded with a heater 16 to hold a melt 14 received in the crucible 10 at a predetermined temperature. A tubular heat insulator 17 is provided between the heater 16 and the side wall 40, to inhibit the fluctuation of a temperature in the melt 14 and a growing single crystal 15.

Figure 1:
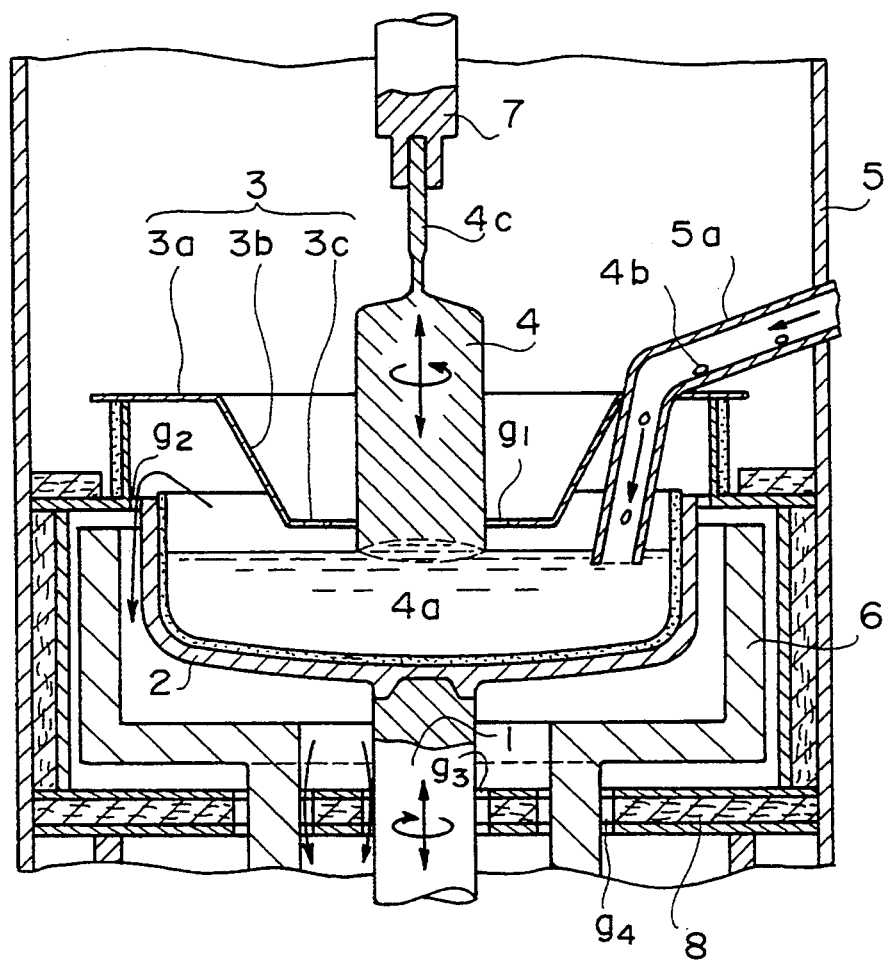
FIG. 1 is a schematic view illustrating a conventional apparatus for pulling a single crystal from a melt.

The screen 30 is supported at its top end by a proper support member (the same member as shown in FIG. 1) and held at a predetermined height above the surface of the melt 14. The screen 30 may be carried upwards or downwards, as shown by the arrow in FIG. 2, in response to the height of the surface of the melt 14.

The surface of the melt 14 is exposed to the inner atmosphere at the opening 25 defined by the inner edges of the shield blades $21_1$–$21_4$. The area of the opening 25 as well as the height of the shield blades $21_1$–$21_4$ are adjusted in response to the progress of crystal growth.

At the initial stage of crystal growth, the crucible 10 receives a sufficient amount of the melt 14, and the surface of the melt 14 is at a higher position. In addition, the single crystal 15 being pulled up from the melt 14 is small in diameter. Hereon, the shield blades $21_1$–$21_4$ are carried to a position near the single crystal 15 to make the area of the opening 25 small.

The area of the opening 25 may be adjusted by a proper interlocking mechanism for synchronizing the motion of the operation rods $23_1$–$23_4$ to carry the shield blades $21_1$–$21_4$ at the same time. The inner edge of each shield blade $21_1$–$21_4$ may be formed into a properly curved shape capable of making the opening 25 approximately circular around the single crystal 15. Although four shield blades $21_1$–$21_4$ are shown in FIG. 3, the number of the shield blades may be properly determined taking into consideration the shielding effect to the surface of the melt 14 as well as the complexity of the structure.

The single crystal 15 becomes larger in diameter in the progress of crystal growth. The amount of the melt 14 in the crucible 10 is reduced by consumption for crystal growth, so that the surface of the melt 14 becomes lower. Hereon, the shield blades $21_1$–$21_4$ are radially carried outwards to make the area of the opening 25 larger in response to the enlargement of the single crystal 15 in diameter. A distance from the surface of the single crystal 15 to the inner edges of the shield blades $21_1$–$21_4$ is changed in this way.

Since the position of the shield blades $21_1$–$21_4$ is adjusted, inert gas flows through the opening 25 to the space avobe the melt 14 under the same condition from the beginning of crystal growth to the stationary state. In addition, the height from the surface of the melt 14 to the shield blades $21_1$–$21_4$ is held at a constant value regardless the lowering of the surface of the melt 14, by lifting the crucible 10 or lowering the shield blades $21_1$–$21_4$. The movement of the shield blades $21_1$–$21_4$ and the vertical motion of the screen 30 and/or the crucible 10 may be automatically controlled.

Figure 4:
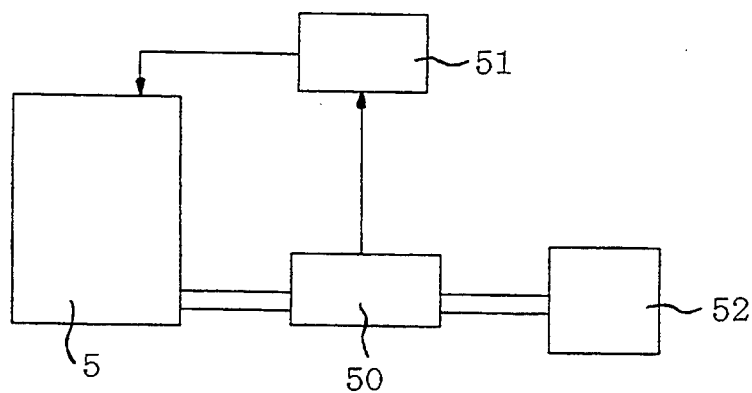
FIG. 4 is a schematic view for explaining the operation of a single crystal pulling apparatus in Example 2.

For instance, the surface of the melt 14 and the surface of the single crystal 15 are detected by proper position sensors. An amount of CO and/or $CO_2$, in the appratus 5 is measured by a gas detector 50, as shown in FIG. 4. The internal pressure of the appratus 5 is controlled properly using a vacuum pump 52.

The detected values are used as control data for determining the carrying distance of the shield blades $21_1$–$21_4$ to control the gap $g_1$ defined by the shield blades $21_1$–$21_4$. The motion of the screen 30 and/or the crucible 10 is controlled in the same way. Thereby, the amount of SiO evaporating from the melt 14 is kept at the most preferable value corresponding to the progress of crystal growth from the beginning to the end. Consequently, oxygen concentration in an obtained single crystal is made uniform along the growing direction of the single crystal.

According to the present invention, the gap between the shield blades $21_1$–$21_4$ and the single crystal 15 as well as the height from the surface of the melt 14 to the shield blades $21_1$–$21_4$ are held at constant values or properly controlled in response to the progress of crystal growth. Consequently, the surface of the single crystal 15 is exposed to radiant heat discharged from the melt 14 under the same condition from the beginning of crystal growth to the stationary state. Hereby, the crystal growth uniformly continues under a predetermined condition, and the quality of an obtained single crystal is excellent without heterogeneity along the growing direction.

Since the melt 14 in the crucible 10 is gradually consumed for the single crystal 15, the surface of the melt 14 becomes lower in the progress of crystal growth. As a result, the contact surface between the melt 14 and the inner surface of the crucible 10 becomes narrower, so as to gradually reduce the amount of oxygen dissolved from the quartz crucible 12 into the melt 14. Taking into consideration the gradual reduction of dissolved oxygen, the flow speed of inert gas passing through the gap g, is made slower, while the gap g, is made larger to suppress the evaporation of SiO from the melt 14. Hereby, the lowering of oxygen concentration in the single crystal 15 is inhibited at the latter stage of crystal growth.

EXAMPLE

A crucible filled with a Si material was set in a vacuum chamber, and an inner pressure was held at 13 torr. A Si melt was prepared by heating and melting the Si material, and held at 1450° C. A single crystal of inches in diameter in a stationary state was pulled up from the Si melt while circulating Ar gas in a flow amount of 60 liter/min.

When the gap $g_1$ was adjusted to 30–40 mm, the inert gas flowed through the gap $g_1$ at a speed 190–270 cm/sec. In this case, oxygen atoms were introduced into the single crystal at a concentration of $1.3 \times 10^{18}/cm^3$.

When the internal pressure was approximately 1 atm., the gap $g_1$ was adjusted to 2–3 mm to let the inert gas flow through the gap $g_1$ at a flow speed of 50–70 cm/sec. The single crystal pulled up under this condition has the same oxygen concentration.

The gap $g_1$ was changed within the range of 2–60 mm during the crystal growth, by changing the position of the inner edges of the shield blades on the basis of the aforementioned relationship between the gap $g_1$ and the oxygen concentration. The obtained single crystal had an oxygen concentraion of $1.3 \times 10^{18}/cm^3$ uniform along the growing direction, and defects such as dislocations originated in harmful ingredients were not detected in the obtained single crystal.

According to the present invention as abovementioned, shield blades capable of sliding motion are provided between a screen and the surface of a melt. The most appropriate condition for crystal growth is held by controlling the sliding motion of the shield blades in the progress of the crystal growth. When gaseous components such as SiO and CO are accompanied with the flow of inert gas and discharged to the outside, the condition for the uniform crystal growth is not disturbed by the flow of inert gas. Consequenly, an obtained single crystal has uniform quality and does not contain defects such as dislocations. In addition, a single crystal different in diameter can be produced using the same apparatus only by changing the position of the inner edges of the shield blades.

What is claimed is:

1. A single crystal pulling apparatus comprising:
   a crucible for receiving melt from which a single crystal is pulled up,
   a pulling shaft having a lower end thereof to which a seed crystal is to be attached,
   a screen located above said melt,
   a plurality of shield blades provided between a surface of said melt and said screen, at least one of said plurality of shield blades being movable to vary a size of an opening defined by inner edges of each of the plurality of blades, and
   means for supplying inert gas through a gap between the inner edges of said shield blades and the surface of said single crystal to a space above said melt and then discharging said inert gas to the outside,
   wherein the opening defined by the inner edges of said shield blades serves as a space for pulling said single crystal from said melt, and the distance from the inner edges of said shield blades to the surface of said single crystal is changed by a sliding motion of said at least one shield blade.

2. The apparatus according to claim 1, wherein the sliding motion of the shield blades is controlled so as to keep the concentration of CO or $CO_2$ in the internal atmosphere at the most appropriiate value for crystal growth.

3. An apparatus according to claim 1, wherein each of said plurality of shield blades is separately movable in a horizontal direction toward and away from a seed crystal being formed.

4. A single crystal pulling apparatus as recited in claim 1, wherein said at least one of said plurality of shield blades overlaps a portion of another of said plurality of shield blades, and each of said plurality of shield blades is individually movable in a horizontal direction toward and away from said seed crystal.

* * * * *